(12) United States Patent
Koshizuka

(10) Patent No.: US 8,274,850 B2
(45) Date of Patent: Sep. 25, 2012

(54) MEMORY SYSTEM, SEMICONDUCTOR MEMORY DEVICE, AND WIRING SUBSTRATE

(75) Inventor: Atsuo Koshizuka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 267 days.

(21) Appl. No.: 12/656,231

(22) Filed: Jan. 21, 2010

(65) Prior Publication Data

US 2010/0182817 A1 Jul. 22, 2010

(30) Foreign Application Priority Data

Jan. 22, 2009 (JP) ................................. 2009-011641

(51) Int. Cl.
*G11C 7/00* (2006.01)
(52) U.S. Cl. .......................................... 365/191; 326/30
(58) Field of Classification Search .................... 326/30, 326/82; 365/191, 230
See application file for complete search history.

(56) References Cited

U.S. PATENT DOCUMENTS

| | | | |
|---|---|---|---|
| 7,180,327 B2 * | 2/2007 | So et al. ........................... | 326/30 |
| 7,342,411 B2 | 3/2008 | Vergis et al. | |
| 7,707,469 B2 * | 4/2010 | Lee et al. ........................ | 714/721 |

OTHER PUBLICATIONS

JEDEC Standard, DDR3 SDRAM Specification, JESD 79-3B, Apr. 2008, JEDEC Solid State Technology Association, pp. 37, 89-105.

* cited by examiner

*Primary Examiner* — VanThu Nguyen
(74) *Attorney, Agent, or Firm* — McGinn IP Law Group, PLLC

(57) ABSTRACT

A memory system includes a plurality of semiconductor memory devices each including a termination resistance circuit that can be controlled to be turned on or off from an outside by a termination resistance control signal, and a memory controller. The memory controller includes a termination resistance control unit that outputs the termination resistance control signal so that when a read command or a write command is executed on one of the semiconductor memory devices, termination resistances of all of the semiconductor memory devices are turned on, and when any of the semiconductor memory devices does not execute the read command or the write command, the termination resistances of all of the semiconductor memory devices are turned off. The termination resistance circuit of one of the semiconductor memory devices is turned off, irrespective of the level of the termination resistance control signal when the one of the semiconductor memory devices outputs data in response to the read command.

16 Claims, 11 Drawing Sheets

FIG. 2

| DIMM CONFIGURATION | COMMAND | TARGET DIMM | TARGET RANK | CONTROLLER TERMINATION RESISTANCE (Ω) | DIMM1 Rank-1 (Ω) | DIMM1 Rank-2 (Ω) | DIMM2 Rank-1 (Ω) | DIMM2 Rank-2 (Ω) |
|---|---|---|---|---|---|---|---|---|
| 2R/2R | WRITE | 1 | 1 | off | 120 | off | 40 | 40 |
| | WRITE | 1 | 2 | off | off | 120 | 40 | 40 |
| | WRITE | 2 | 1 | off | 40 | 40 | 120 | off |
| | WRITE | 2 | 2 | off | 40 | 40 | off | 120 |
| | READ | 1 | 1 | 60 | off | off | 40 | 40 |
| | READ | 1 | 2 | 60 | off | off | 40 | 40 |
| | READ | 2 | 1 | 60 | 40 | 40 | off | off |
| | READ | 2 | 2 | 60 | 40 | 40 | off | off |
| 2R/1R | WRITE | 1 | 1 | off | 120 | off | 20 | NA |
| | WRITE | 2 | 1 | off | off | 120 | 20 | NA |
| | READ | 1 | 1 | 60 | 40 | off | 20 | NA |
| | READ | 2 | 1 | 60 | 40 | 40 | off | NA |
| 1R/1R | WRITE | 1 | 1 | off | 120 | NA | 20 | NA |
| | WRITE | 2 | 1 | off | 20 | NA | 120 | NA |
| | READ | 1 | 1 | 60 | off | NA | 20 | NA |
| | READ | 2 | 1 | 60 | 20 | NA | off | NA |

FIG. 6

| DIMM CONFIGURATION | COMMAND | TARGET DIMM | TARGET RANK | CONTROLLER TERMINATION RESISTANCE (Ω) | DIMM1 Rank-1 (Ω) | DIMM1 Rank-2 (Ω) | DIMM2 Rank-1 (Ω) | DIMM2 Rank-2 (Ω) |
|---|---|---|---|---|---|---|---|---|
| 2R/2R | WRITE | 1 | 1 | off | 120 | 120 | 120 | 120 |
|  | WRITE | 1 | 2 | off | 120 | 120 | 120 | 120 |
|  | WRITE | 2 | 1 | off | 120 | 120 | 120 | 120 |
|  | WRITE | 2 | 2 | off | 120 | 120 | 120 | 120 |
|  | READ | 1 | 1 | 60 | off | 120 | 120 | 120 |
|  | READ | 1 | 2 | 60 | 120 | off | 120 | 120 |
|  | READ | 2 | 1 | 60 | 120 | 120 | off | 120 |
|  | READ | 2 | 2 | 60 | 120 | 120 | 120 | off |
| 1R/1R | WRITE | 1 | 1 | off | 120 | NA | 120 | NA |
|  | WRITE | 2 | 1 | off | 120 | NA | 120 | NA |
|  | READ | 1 | 1 | 60 | off | NA | 120 | NA |
|  | READ | 2 | 1 | 60 | 120 | NA | off | NA |

MEMORY SYSTEM, SEMICONDUCTOR MEMORY DEVICE, AND WIRING SUBSTRATE

TECHNICAL FIELD

Reference to Related Application

This application is based upon and claims the benefit of the priority of Japanese patent application No. 2009-011641 filed on Jan. 22, 2009, the disclosure of which is incorporated herein in its entirety by reference thereto.

The present invention relates to a memory system, a semiconductor memory device, and a wiring substrate. More specifically, the invention relates to a wiring substrate on which semiconductor memory devices are mounted.

BACKGROUND

There have been remarkable increases in capacity and speed of a memory system that uses semiconductor memory devices such as dynamic RAMs. In the memory system on which DDR SDRAMs (Double Data Rate Synchronous DRAMs) are mounted in particular, internal operations of the semiconductor memory devices are pipelined, and commands that have been supplied from an outside in synchronization with a clock are sequentially executed. Together with the sequential execution of the commands, it is arranged that data transfer is performed between a DDR SDRAM and the memory controller at a rate twice as the frequency of the clock, thereby implementing a high-speed system operation. In the DDR SDRAM or the like, a DLL (Delay Locked Loop) circuit is employed. Then, an internal circuit is operated in synchronization with the clock supplied from the outside. High-speed data transfer is thereby implemented. In the DDR SDRAM after a DDR2 in particular, a termination resistance is included in each of data input/output terminals such as a DQ terminal and a DQS terminal. Then, a control signal is supplied to an ODT terminal of the DDR SDRAM from the memory controller to control turning on or off of the termination resistance, thereby reducing reflection from the data input/output terminal. A high data transfer is thereby implemented.

FIG. 1 is a configuration diagram of an overall memory system of a related art. FIG. 1 is the memory system for reading and writing of 64 bits in parallel. A semiconductor memory device 101 is used for reading and writing of eight bits in parallel. Eight semiconductor memory devices 101 are connected in parallel to perform reading and writing of 64 bits in parallel. In the memory system in FIG. 1, a configuration is assumed in which two ranks of the semiconductor memory devices 101 are respectively mounted on two DIMMs (Dual Inline Memory Modules). That is, the memory system is formed of the semiconductor memory devices of a total of four ranks which are indicated by DIMM1 Rank-1, DIMM1 Rank-2, DIMM2 Rank-1, and DIMM2 Rank-2. Each rank is further formed of the eight semiconductor memory devices 101. A total of 4 ranks*8=32 semiconductor memory devices 101 are mounted. FIG. 1 illustrates only three of the eight semiconductor memory devices 101 connected in parallel. Signals that control these 32 semiconductor memory devices 101 are supplied from the memory controller 102, and data input/output is performed between the memory controller and each of the semiconductor memory devices 101.

Referring to FIG. 1, the memory controller 102 is directly connected to each semiconductor memory device 101. The memory system may include a so-called Registered DIMM or a Fully Buffered DIM (FBDIMM) in which a PLL or a buffer register is arranged between the memory controller 102 and the semiconductor memory device 101 for each DIMM, and timing synchronization with the memory controller is sought for each DIMM. The memory controller 102 may be an LSI having a function dedicated for memory control. Alternatively, a CPU may directly control the memory. Alternatively, the memory controller 102 may be formed of a plurality of LSIs.

Referring to FIG. 1, reference characters ADR and CMD respectively indicate an address signal and a command signal, which are connected in common to the semiconductor memory devices 101 of each rank, from the memory controller 102. The command signal CMD includes a row address strobe signal /RAS, a column address strobe signal /CAS, and a write enable signal /WE. Signals DQ0 to DQ63 are bidirectional data input/output signals used for transfer of read/write data or the like between the memory controller 102 and the semiconductor memory devices 101. It is assumed that each semiconductor memory device 101 is used for input/output of eight bits in parallel. Thus, the eight semiconductor memory devices 101 are connected in parallel in order to accommodate 64 bits of the signals DQ0 to DQ63. These data input/output signals DQ0 to DQ63 are also connected in common to each rank. DQS0 and /DQS0 signals, DQS1 and /DQS1 signals, DQS2 and /DQS2 signals, DQS3 and /DQS3 signals, DQS4 and /DQS4 signals, DQS5 and /DQS5 signals, DQS6 and /DQS6 signals, and DQS7 and /DQS7 signals are respectively differential data strobe signals. Each pair of the differential data strobe signals is transferred to a corresponding one of the semiconductor memory devices 101 from the memory controller 102 at a time of a write operation, and is transferred to the memory controller 102 from the corresponding one of the semiconductor memory devices 101 at a time of a read operation. These DQS and /DQS signals are bidirectional input/output signals. The data strobe DQS and /DQS signals output by the semiconductor memory device 101 at the time of the read operation are synchronized with a change point of read data. Thus, when the DQS and /DQS signals are used as the strobe signals on the side of the memory controller 102, the phases of the DQS and /DQS signals are deviated at a timing in which a data signal can be latched. These data strobe signals DQS0 to DQS7 and /DQS0 to /DQS7 are also connected in common to each rank of the semiconductor memory devices. However, an independent pair of the DQS and /DQS signals is connected to each of the eight semiconductor memory devices 101 of each rank connected in parallel.

Clock signals CK0 to CK3 and /CK0 to /CK3, clock enable signals CKE0 to CKE3, chip select signals /CS0 to /CS3, and embedded termination resistance control signals ODT0 to ODT3 are signals that are output from the memory controller 102 to the semiconductor memory devices 1. Different ones of these signals that are independent are output for each rank. The clock signals CK0 to CK3 and /CK0 to /CK3 are signals that are supplied to the semiconductor memory devices 1 as system clocks. A command for a read, a write, or the like supplied from the memory controller 102 to the semiconductor memory device 101 is supplied in synchronization with a corresponding pair of the system clocks. The clock enable signals CKE0 to CKE3 are signals each of which determines whether the corresponding clock CK is valid or invalid. When the clock enable signal CKE is high at a rising edge of the corresponding clock CK, the subsequent rising edge of the corresponding clock CK is valid. Edges of the corresponding clock CK other than the subsequent rising edge are invalid. When each of the chip select signals /CS0 to /CS3 is low, input of a command is valid. When each of the chip select signals /CS0 to /CS3 is high, the command is ignored. Operation, however, is continued. By supplying the command to the semiconductor memory device 101 of an arbitrary one of the ranks using this chip select signal, a selective access can be made. When values of termination resistances inside the respective memory devices 1 are not infinite, the embedded termination resistance control signals ODT0 to ODT3 can control turning on or off of the termination resistances. When the embedded termination resistance control signals ODT0 to ODT3 are high, the termination resistances are turned on. When the embedded termination resistance control signals ODT0 to ODT3 are low, the termination resistances are turned off.

With respect to routing of data buses (for the DQ signals, DQS signals) from the memory controller to the semiconductor memory devices 101 in FIG. 1, the routing is performed using a so-called fly-by (FLY-BY) topology. In this topology, the DIMM1s are mounted at far ends of lines extending from the memory controller 102 and the DIMM2s are mounted midway from the memory controller 102 to the DIMM1s so that no stub (stub, or unterminated section of line) occurs even when only the DIMM1s are mounted and no DIMM2s are mounted. Routing by the fly-by topology is to prevent signal reflection from the stub when only the DIMM1s are mounted without mounting the DIMM2s.

Next, an example of preferable setting of termination resistances when the semiconductor memory device 101 is a DDR3 SDRAM is shown in FIG. 2. FIG. 2 assumes a case (2R/2R) where DDR3 SDRAMs having two ranks of the DIMM1s and two ranks of the DIMM2s have been mounted, a case (2R/1R) where DDR3 SDRAMs having two ranks of the DIMM1s and one rank of the DIMM2 have been mounted, and a case (1R/1R) where DDR3 SDRAMs having one rank of the DIMM1 and one rank of the DIMM2 have been mounted. FIG. 2 shows each of write and read (WRITE, READ) commands supplied from the memory controller 102, the DIMM to be accessed by the write or read command and the rank of the DIMM, a termination resistance value of the memory controller 102 when the write or read command is executed, and a termination resistance value of each rank of each DIMM mounted on a board in each case. Termination resistance values are set in termination resistance value specifying registers of the semiconductor memory devices 101 by the memory controller 102 in advance.

The DDR3 SDRAM has a dynamic ODT function. Thus, the DDR3 SDRAM includes a write-command execution time termination resistance value specifying register and a nominal termination resistance value specifying register. The write-command execution time termination resistance specifying register specifies a termination resistance value when the write command is executed. The nominal termination resistance value specifying register specifies a termination resistance value except when the write command is executed. When the dynamic ODT function is selected, the termination resistance value can be changed between a time when the write command is executed and a time except when the write command is executed. That is, when the dynamic ODT function is used, whether to turn off or turn on the termination resistance is controlled by the ODT terminal. When the termination resistance is turned on, different resistance values of the termination resistance can be specified between the time when the write command is executed and the time except when the write command is executed. Referring to FIG. 2, different resistance values are set as the termination resistance value of the rank targeted for execution of the write command and the termination resistance value not targeted for execution of the write command, using the dynamic ODT function. When the termination resistance value setting as shown in FIG. 2 is performed, signal reflection can be appropriately prevented.

Specifications of the DDR3 SDRAM including the dynamic ODT function are described in Non-patent Document 1 (on pages 89 to 105). Patent Document 1 describes an example of termination resistance setting similar to that in FIG. 2.

[Patent Document 1] U.S. Pat. No. 7,342,411
[Non-patent Document 1] JEDEC STANDARD DDR3 SDRAM Specification, JESD79-3B, April, 2008, JEDEC Solid State Technology Association (JEDEC SOLID STATE TECHNOLOGY ASSOCIATION), pages 37, 89 to 105

SUMMARY

The entire disclosures of Patent Document 1 and Non-patent Document 1 are incorporated herein by reference thereto. The following analysis is given by the present invention.

As mentioned above, while high-speed data transfer is demanded in the memory system, reduction of power consumption is demanded. One of bottlenecks in the reduction of power consumption is consumption of power by a synchronous circuit such as a DLL, used in each semiconductor memory device. It takes time for the synchronous circuit such as the DLL or the PLL to start to be activated and then be locked. Thus, it is necessary to constantly operate the synchronous circuit at a high speed. Accordingly, even when there is no access, large power consumption is needed.

Though the DDR3 SDRAM includes a DLL-off mode in which the DLL is turned off, a timing of turning on or off the termination resistance and a data input/output switch timing are not defined in the DLL-off mode.

One of a pair of ranks of the DIMMs that are not accessed may be set to a power-down mode to stop the DLLs. Power consumption may be thereby reduced. However, when the pair of ranks of the DIMMs is accessed, termination resistance control is needed for the rank of the DIMM as well that has been set to the power-down mode. In this case as well, when the power-down mode has been set, termination resistance control cannot be performed at a timing that is the same as in a normal operation mode.

A memory system according to one aspect of the present invention comprises: a plurality of semiconductor memory devices each comprising a termination resistance circuit that may be controlled to be turned on or off from an outside by a termination resistance control signal; and a memory controller including a termination resistance control unit that outputs the termination resistance control signal so that when a read command or a write command is executed on one of the semiconductor memory devices, termination resistances of all of the semiconductor memory devices are turned on, and when any of the semiconductor memory devices does not execute the read command or the write command, the termination resistances of all of the semiconductor memory devices are turned off. The termination resistance circuit of the one of the semiconductor memory devices is turned off, irrespective of a level of the termination resistance control signal when the one of the semiconductor memory devices outputs data in response to the read command.

A memory system according to other aspect of the present invention comprises: a plurality of semiconductor memory devices each comprising a termination resistance circuit that may be controlled to be turned on or off from an outside by a termination resistance control signal, the termination resistance circuit of one of the semiconductor memory devices being turned off irrespective of a level of the termination resistance control signal when the one of the semiconductor memory devices outputs data in response to a read command; and a memory controller that controls the semiconductor memory devices and comprises a termination resistance control unit which sets an initial resistance value of the terminal resistance circuit and controls turning on or off of the termination resistance circuit by the termination resistance control signal. Each of the semiconductor memory devices comprises a normal operation mode in which a write command and the read command may be executed and a power-down mode in which execution of the write command and the read command is stopped. On/off timings of the termination resistance circuit by the termination resistance control signal in the normal operation mode and the power-down mode are substantially the same.

A semiconductor memory device according to another aspect of the present invention comprises: an embedded termination resistance connected to a data input/output terminal; a termination resistance control terminal that controls turning on or off of the embedded termination resistance from an outside; and a termination resistance control circuit that turns off the embedded termination resistance irrespective of a level of the termination resistance control terminal when the semiconductor memory device outputs read data to the data input/output terminal, in response to a read command.

A wiring substrate according to still another aspect of the present invention comprises: a termination resistance; a termination resistance control terminal that controls turning on or off of the termination resistance from an outside; and a plurality of semiconductor memory devices mounted thereon, each of the semiconductor memory devices having a function of turning off the termination resistance irrespective of a level of the termination resistance control terminal when a read command is executed. The wiring substrate comprises a common data bus to which the semiconductor memory devices are connected in common. Each of the semiconductor memory devices is connected to the common data bus through a branch bus branched from the common data bus, and each branch bus is routed so that wiring lengths from arbitrary points on the common data bus to the respective semiconductor memory devices are equal.

The meritorious effects of the present invention are summarized as follows.

According to the present invention, there is obtained a memory system, a semiconductor memory device, and a wiring substrate in which the embedded termination resistance can be controlled to be turned on or off at an appropriate timing and data can be transferred at a high speed, even if a data input/output timing is varied with respect to a system clock.

BRIEF DESCRIPTIONS OF THE DRAWINGS

FIG. 2 shows an example of set termination resistance values in DDR3 SDRAMs;

FIG. 6 shows an example of setting of termination resistance values in the semiconductor memory device in the example of the present invention;

PREFERRED MODES

Figure 1:
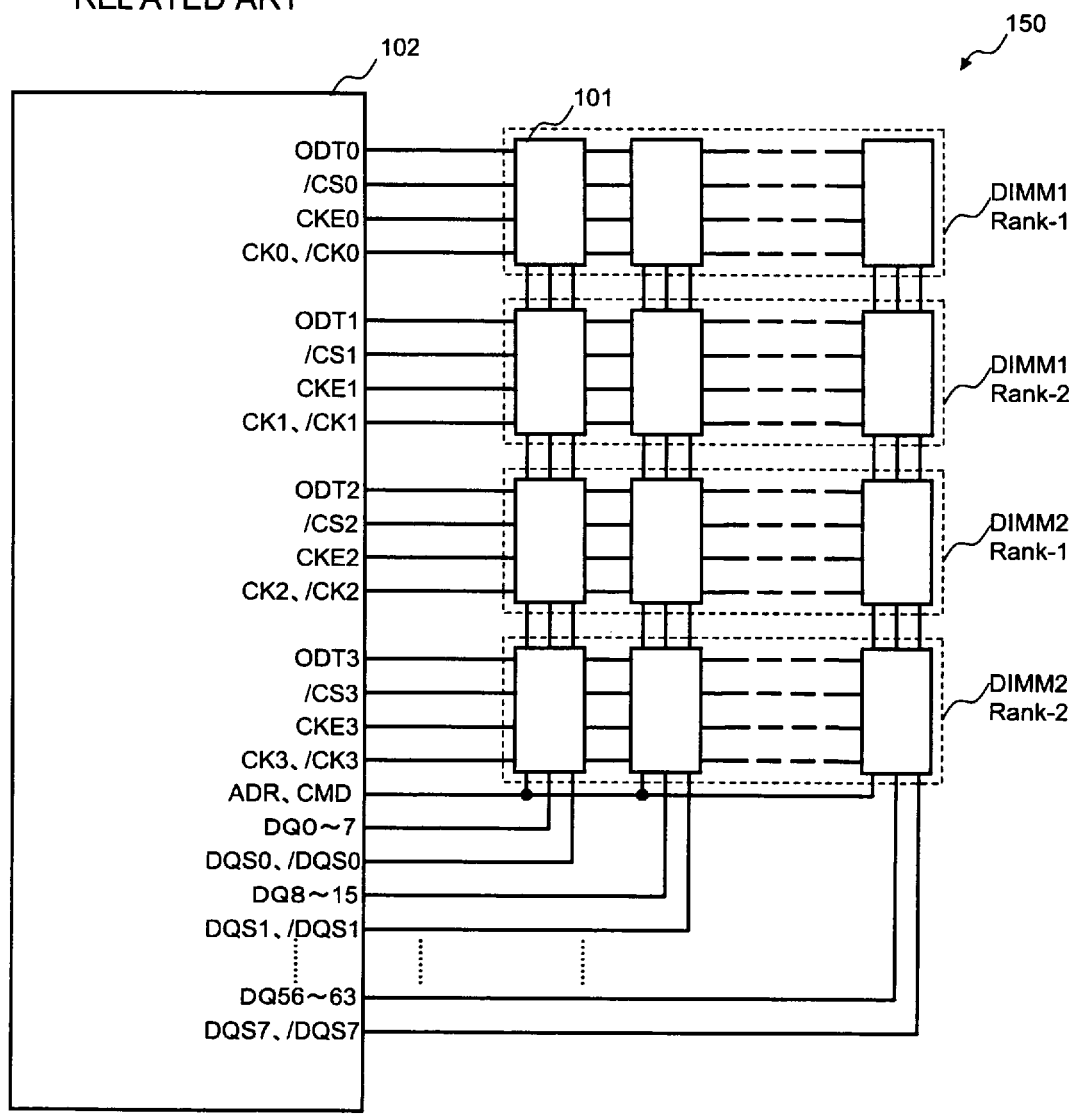
FIG. 1 is a configuration diagram of an overall related art memory system of which routing is performed using a fly-by topology.

Exemplary embodiments of the present invention will be described with reference to drawings, as necessary. The drawings and reference symbols in the drawings that are cited in the description of the exemplary embodiments are shown as an example of the exemplary embodiments, and do not thereby limit variations of the exemplary embodiments of the present invention.

As shown in FIGS. 3 to 6, for example, a memory system 50 in one exemplary embodiment of the present invention comprises a memory controller and a plurality of semiconductor memory devices 1 each including a termination resistance circuit 25. The termination resistance circuit 25 may be controlled to be turned on or off from an outside by a termination resistance control signal (ODT0, ODT1, ODT2, or ODT3). The memory controller includes a termination resistance control unit 3 that outputs a termination resistance control signal so that termination resistances of all the semiconductor memory devices 1 are turned on when a read command or a write command is executed on one of the semiconductor memory devices 1 and the termination resistances of all the semiconductor memory devices 1 are turned off when any of the semiconductor memory devices 1 does not execute the read command or the write command. The termination resistance circuit 25 of the one of the semiconductor memory devices 1 is turned off, irrespective of a level of the termination resistance control signal (ODT0, ODT1, ODT2, or ODT3) when the one of the semiconductor memory devices 1 outputs data, in response to the read command. That is, turning on/off of a termination resistance (indicated by reference numerals 87 and 88 in FIG. 5) included in the termination resistance circuit can be controlled by an ODT signal input from an ODT terminal 23. When no read or write access is made to the semiconductor memory device 1 of any rank, the ODT signal can be driven low, the termination resistance can be turned off, and current that flows through the termination resistance can be reduced. When the read command or the write command is executed on the semiconductor memory device of one of the ranks, termination is performed by driving the ODT signal high. Reflection is thereby reduced. When the semiconductor memory device executes the read command to output read data, it is necessary to turn off the termination resistance. The semiconductor memory device, however, turns off the termination resistance, irrespective of the level of the ODT signal when the read command is executed. With the above-mentioned configuration, even when a data input/output timing with respect to a system clock is varied without using a synchronous circuit such as a DLL, the embedded termination resistance can be controlled to be turned on or off at an appropriate timing. That is, when the read command is executed, the semiconductor memory device automatically makes determination, and turns off the termination resistance, in synchronization with the data output timing. When the synchronous circuit is not used, mutual switching between the read command and the write command and switching of the termination resistance according to the rank to be accessed may cause a bottleneck in an on/off control timing of the termination resistance. According to the exemplary embodiment described above, no problem occurs with the on/off timing of the termination resistance.

Figure 10:
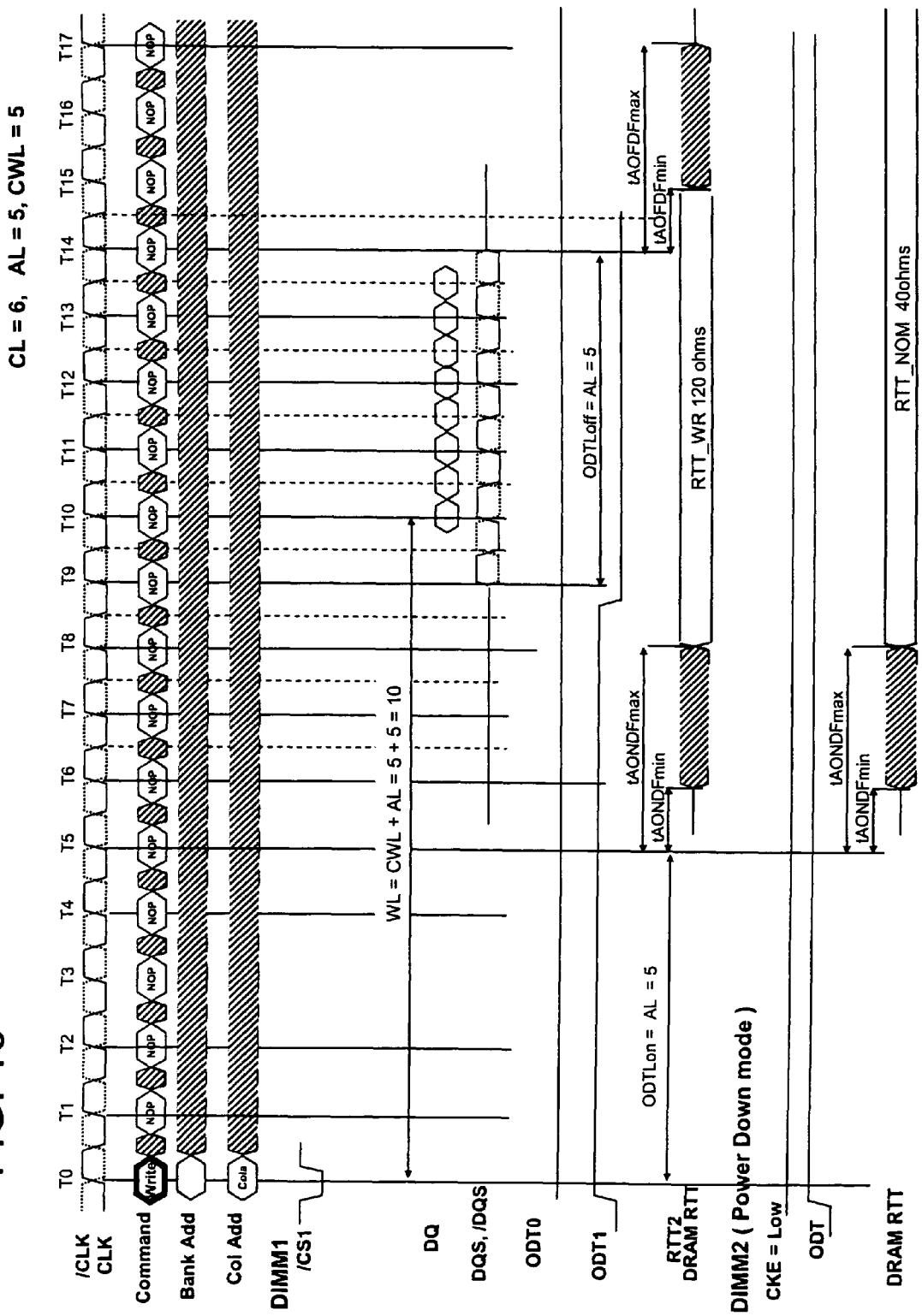
FIG. 10 is a timing diagram in another example of the present invention when a write command is executed.

As shown in FIG. 10 in particular, a memory system 50 in one exemplary embodiment of the present invention comprises a memory controller 2 and a plurality of semiconductor memory devices 1 each including a termination resistance circuit 25. The termination resistance circuit 25 may be controlled to be turned on or off from an outside by a termination resistance control signal (ODT0, ODT1, ODT2, or ODT3). The termination resistance circuit 25 of one of the semiconductor memory devices 1 is turned off, irrespective of a level of the termination resistance control signal (ODT0, ODT1, ODT2, or ODT3) when the one of the semiconductor memory devices 1 outputs data in response to a read command. The memory controller includes a termination resistance control unit 3 that sets an initial resistance value of the termination resistance circuit 25 and controls turning on/off of the termination resistance circuit 25 by the termination resistance control signal (ODT0, ODT1, ODT2, or ODT3). The memory controller controls the semiconductor memory devices 1. Each of the semiconductor memory devices 1 includes a normal operation mode and a power-down mode. In the normal operation mode, a write command and the read command can be executed. In the power-down mode, execution of the write command and the read command is stopped. Timings of turning on/off the termination resistance circuit 25 by the corresponding one of the termination resistance control signals (ODT0 to ODT3) in the normal operation mode and the power-down mode are substantially the same. With the above-mentioned configuration, the memory controller does not need to change control over the termination resistance by the termination resistance control signal, according to whether the semiconductor memory device 1 is in the power-down mode or the normal operation mode. Thus, when there is no need for access, the semiconductor memory device 1 can be readily set to the power-down mode. Power consumption of the semiconductor memory device 1 can be thereby reduced.

Figure 4:
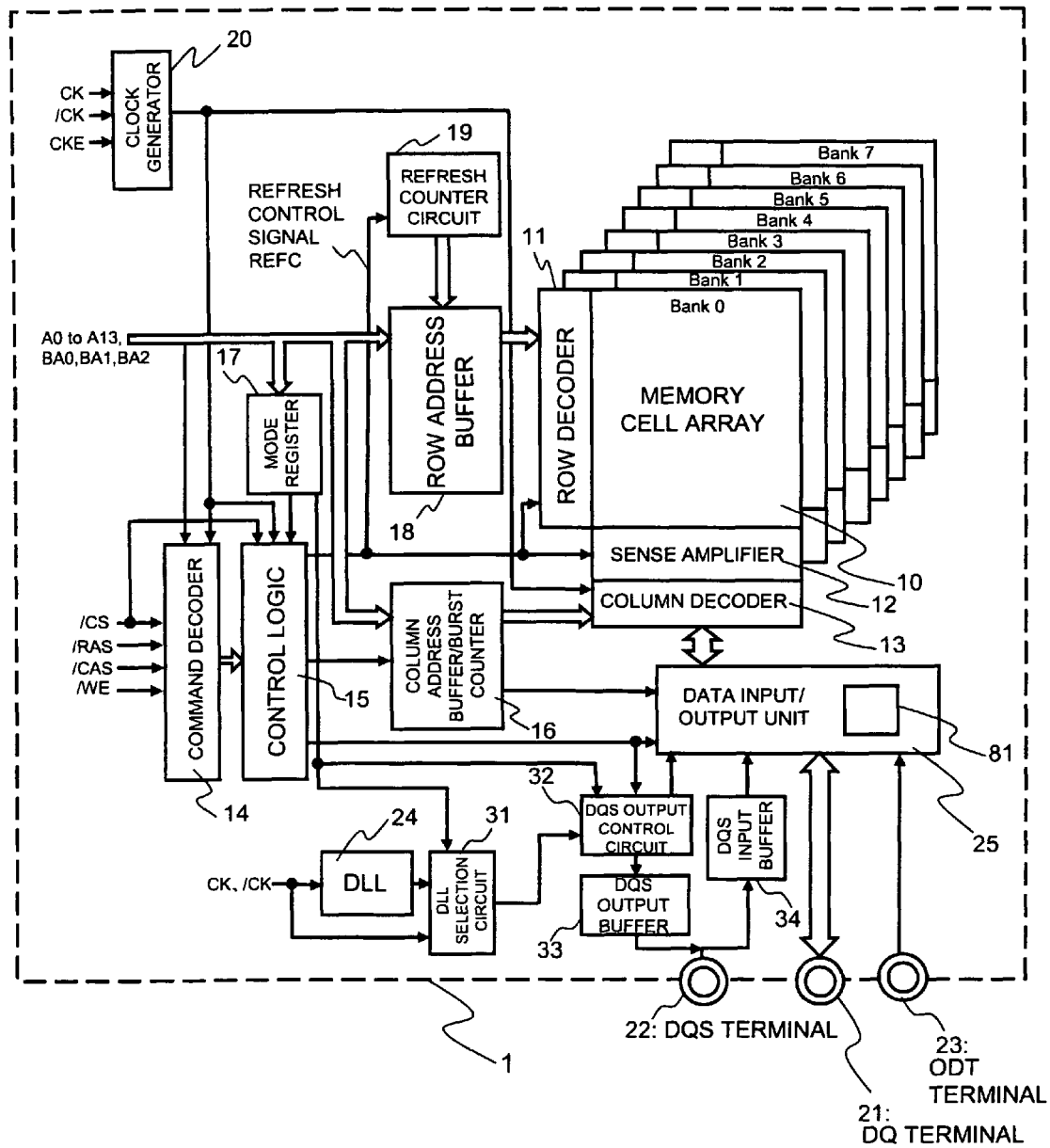
FIG. 4 is a configuration diagram of an overall semiconductor memory device in the example of the present invention.
Figure 5:
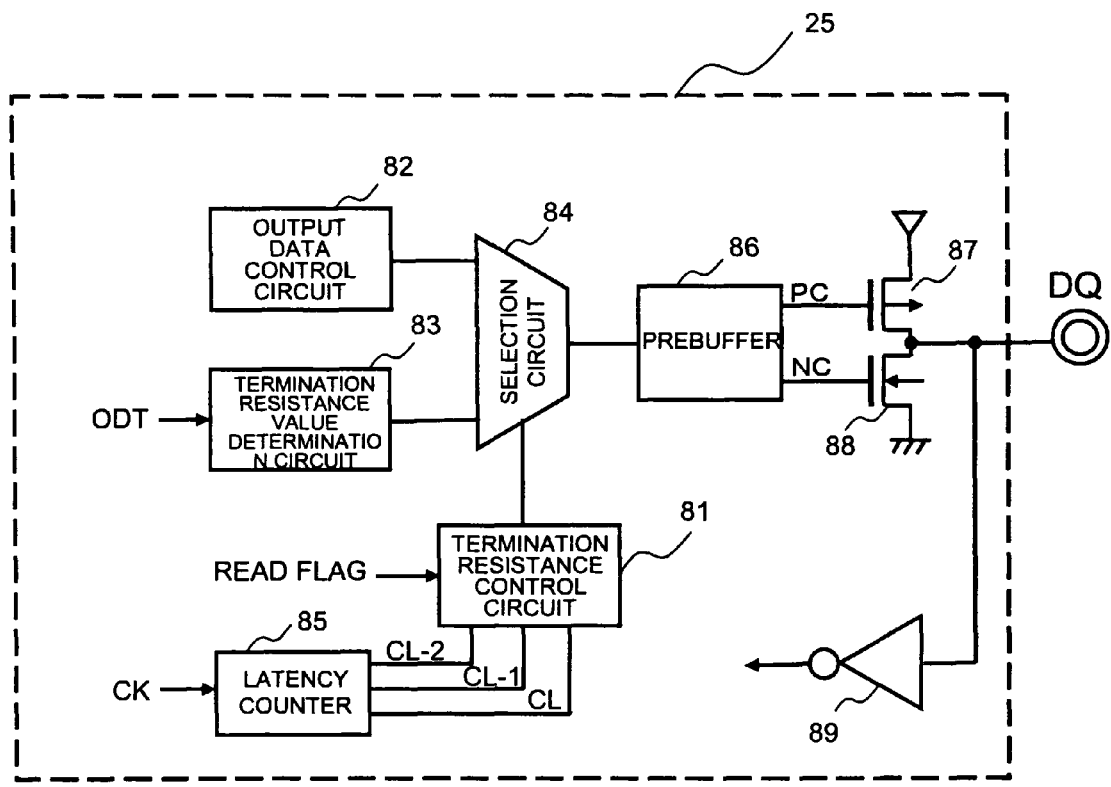
FIG. 5 is a circuit block diagram in the vicinity of a data output terminal in the semiconductor memory device in the example of the present invention.

As shown in FIGS. 4 and 5, a semiconductor memory device 1 in one exemplary embodiment of the present invention comprises an embedded termination resistance (indicated by reference numerals 87 and 88) connected to a data input/output terminal (21), a termination resistance control terminal 23 that controls turning on/off of the embedded termination resistance from an outside, and a termination resistance control circuit 81 that turns off the embedded termination resistance (87, 88) irrespective of a level of the termination resistance control terminal 23 when the semiconductor memory device outputs read data to the data input/output terminal, in response to a read command. In the semiconductor memory device, the embedded termination resistance is turned off when the read data is output. Thus, there is no need for controlling turning on/off of the embedded termination resistance from the outside by the termination resistance control terminal when the read command is executed. When the above-mentioned semiconductor memory device is used, the memory controller may turn off a termination resistance control signal (ODT signal) to reduce current that flows through the termination resistance when no read access or no write access is made to the semiconductor memory device of any rank. When the read access or write access is made to one rank, the memory controller may fix the termination resistance control signal to an on state.

Figure 7:
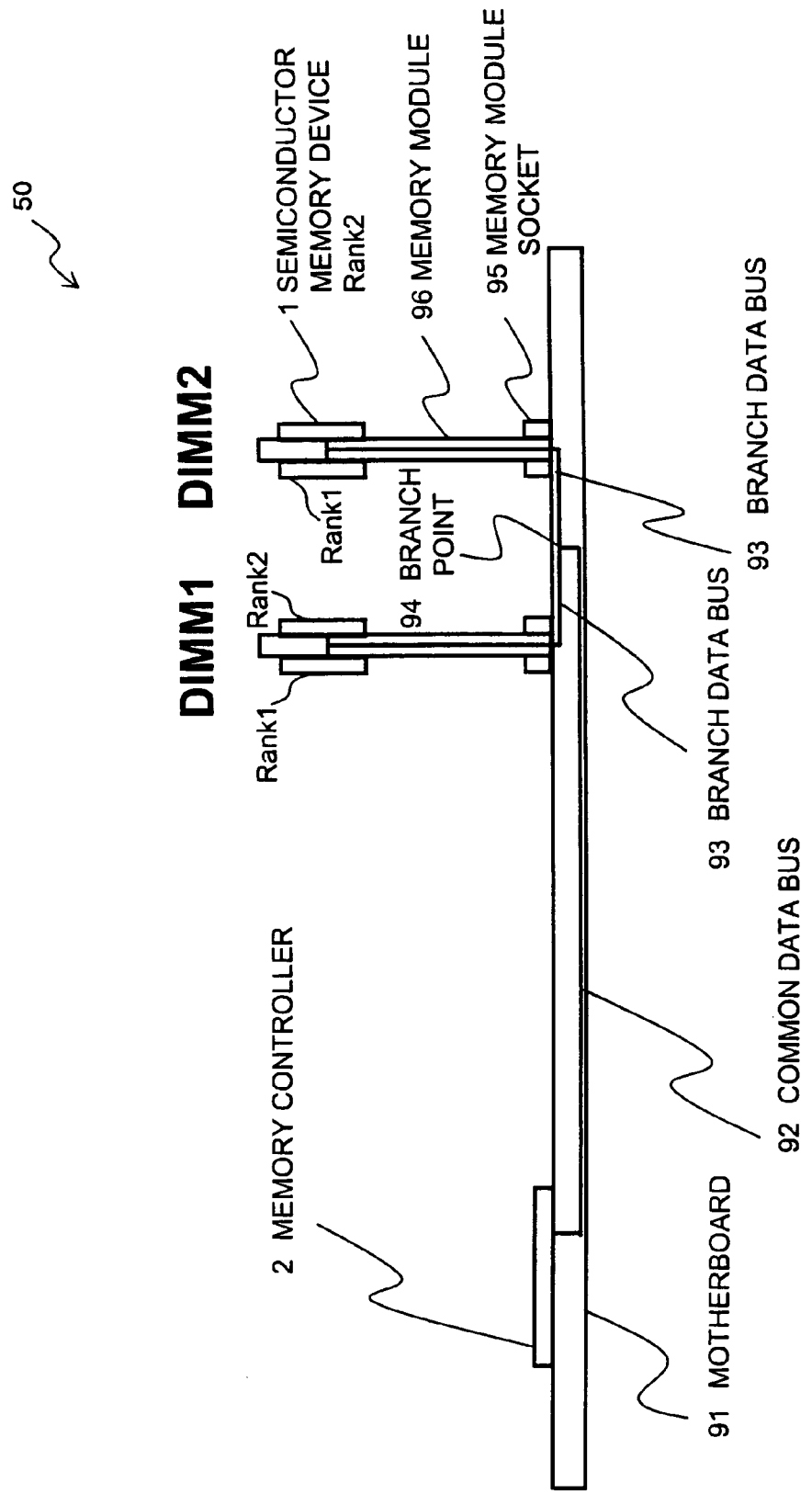
FIG. 7 is a sectional view of a wiring substrate in the example of the present invention.

As shown in FIG. 7, a wiring substrate of the present invention is a wiring substrate 91 on which a plurality of semiconductor memory devices 1 are mounted. Each semiconductor memory device 1 comprises a termination resistance (indicated by reference numerals 87 and 88) and a termination resistance control terminal 23 that controls turning on/off of the termination resistance from an outside. The semiconductor memory device 1 includes a function of turning off the termination resistance (87, 88) irrespective of a level of the termination resistance control terminal 23 when a read command is executed. The wiring substrate 91 includes a common data bus 92 to which the semiconductor memory devices 1 are connected in common. Each of the semiconductor memory devices 1 is connected to the common data bus 92 through a branch bus 93 that branches from the common data bus 92. Each branch data bus 93 is routed so that wiring lengths from arbitrary points on the common data bus 92 to the respective semiconductor memory devices 1 are equal. On the wiring substrate, routing is performed so that data bus wiring lengths to the respective semiconductor memory devices 1 are equal. Assume, for example, that the semiconductor memory device 1 does not include a synchronous circuit such as a DLL or the synchronous circuit dos not operate even if the semiconductor memory device 1 includes the synchronous circuit. Then, when high-speed data transfers associated with execution of the read command and a write command are successively performed, it is difficult to achieve synchronization of and execute control over turning on/off of the termination resistance of each semiconductor device from the memory controller for each command, due to switching between a read and a write and a difference of a rank to be accessed. Even in such a case, when the semiconductor memory device includes the function of turning off the termination resistance at a time of execution of the read command, signal reflection can be reduced to a minimum due to symmetrical routing on the wiring substrate as described above. A detailed description will be given below with reference to drawings.

FIRST EXAMPLE

Figure 3:
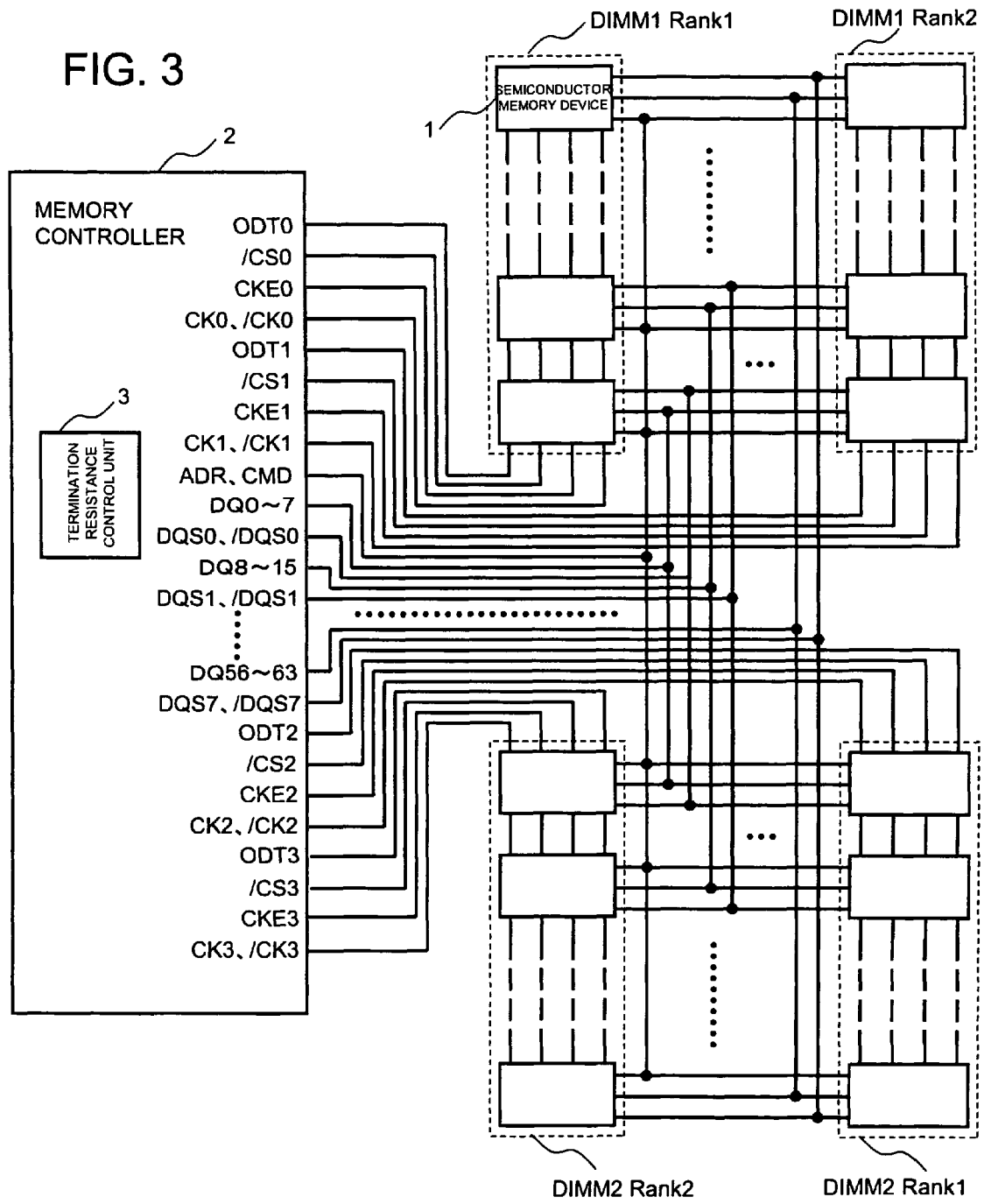
FIG. 3 is a configuration diagram of an overall memory system in an example of the present invention.

FIG. 3 is a diagram showing a configuration of an overall memory system in an example of the present invention. Basic connecting relationships between a memory controller 2 and semiconductor memory devices 1 in FIG. 3 are the same as those in FIG. 1 when the memory controller 102 is replaced by a memory controller 2 and the semiconductor memory devices 101 are replaced by semiconductor memory devices 1. However, referring to FIG. 3, routing is performed so that runs of DQ buses and DQS signal lines are symmetrical for each DIMM and each rank in order to reduce the influence of reflection as much as possible and perform high-speed data transfer even when the synchronous circuit of the semiconductor memory device 1 is not operated, as will be described later. That is, routing is performed so that wiring lengths of the DQ buses from the memory controller 2 to the semiconductor memory devices 1 of each rank of DIMMs are the same as lengths of the DQS signal lines from the memory controller 2 to the semiconductor memory devices 1 of each rank of DIMMs. However, due to convenience for drawing, the DQ buses and the DQS signal lines are not laid out and routed to be completely symmetrical. Even on an actual wiring substrate, it is difficult to lay out and route the DQ buses and the DQS signal lines completely symmetrically. It is, however, preferable to lay out and route the DQ buses and the DQS signal lines to be symmetrical as much as possible. The DQ buses and the DQS signal lines are connected to the respective semiconductor memory devices 1 from the memory controller 2 through a common data bus common to respective ranks of DIMMs and branch buses that are branched from the common data bus. The DQ buses and the DQS signal lines are laid out and routed so that wiring lengths from arbitrary points on the common data bus to the respective semiconductor memory devices are equal. The layout and routing as described above do not necessarily need to be performed. However, it is desirable that the layout and routing be performed as described above, in order to perform the high-speed data transfer.

The memory controller 2 includes a termination resistance control unit 3. The termination resistance control unit 3 initializes the semiconductor memory devices 1 so that each of termination resistances included in DQ terminals, DQS terminals, and /DQS terminals of the semiconductor memory devices 1 assume a certain fixed value except when a read command is executed. Further, control is performed over ODT terminals of the four ranks so that when the read command or a write command is executed on the semiconductor memory device of one of four ranks, the termination resistances are turned on.

On the other hand, when no read or write access is made to any of the four ranks, the ODT terminals of all the ranks can be set to a low level to turn off the termination resistances of each of the semiconductor memory devices 1, thereby allowing reduction of consumption power that flows through the termination resistances. The memory controller 2 may be an LSI including a function dedicated for memory control. Alternatively, the CPU may directly control the memory. Alternatively, the memory controller 2 may be constituted from a plurality of LSIs.

Next, FIG. 4 is a configuration diagram of the entirety of the semiconductor memory device 1. Referring to FIG. 4, reference numeral 10 denotes memory cell arrays, reference numeral 11 denotes row decoders each of which decodes a row address and drives a selected word line, reference numeral 12 denotes sense amplifiers, reference numeral 13 denotes column decoders each of which decodes a column address and selects a selected bit line, reference numeral 14 denotes a command decoder that receives a predetermined address signal and command signals (chip select /CS, row address strobe /RAS, column address strobe /CAS, and write enable /WE signals) and decodes a command, reference numeral 15 denotes a control logic, reference numeral 16 denotes a column address buffer/burst counter, reference numeral 17 denotes a mode register that receives addresses A0 to A13 and signals BA0, BA1 and BA2 for bank selection (selection of one of eight banks), reference numeral 18 denotes a row address buffer, reference numeral 19 denotes a refresh counter circuit that receives a refresh control signal REFC, counts up, and outputs a count output as a refresh address, reference numeral 20 denotes a clock generator, reference numeral 21 denotes a data input/output terminal (DQ terminal) for receiving/outputting read/write data from/to an outside, and reference numeral 24 denotes a DLL circuit, and reference numeral 25 denotes a data input/output unit that performs data input/output between the DQ terminal and one of the memory cell arrays 10, in synchronization with a clock supplied from the DLL or an internal clock generated from an external clock.

Further, a DQS output control circuit 32 and a DQS output buffer 33 that control output of a strobe signal DQS are provided. The strobe signal DQS is output at a time of a data read. When a read command is executed, the DQS signal, for which the timing has been adjusted by the DQS output control circuit 32 and which has been amplified by the DQS output buffer 33, is output from a DQS terminal 22. Further, data is output from the DQ terminal 21, in synchronization with output of the DQS signal. When a write command is executed, the data strobe signal is received through the DQS terminal 22, and data is captured into the data input/output unit 25 through the DQ terminal, in synchronization with the DQS signal shaped by the DQS input buffer 34.

An ODT terminal 23 is a terminal that controls turning on and off of an embedded termination resistance provided at each of the DQ terminal and the DQS terminal. Assume that a value other than an infinite value is set as the resistance value of the embedded termination resistance. Then, when a high level is supplied to the ODT terminal 23, the termination resistance is turned on to assume the set value. On the other hand, when a low level is supplied to the ODT terminal 23, the embedded resistance is turned off, irrespective of the resistance value of the embedded termination resistance set in advance.

At the mode register 17, a CAS latency specifying register which specifies a CAS latency, a DLL selection register that performs switching between a DLL selection mode and a DLL non-selection mode, and registers that control ODT (On-Die Termination), illustration of which are omitted in FIG. 4, are provided.

An output of the DLL selection register is supplied to a DLL selection circuit 31. Then, it can be selected whether to use the clock that has been phase adjusted by the DLL 24 or whether to use the internal clock that is phase delayed and is not phase adjusted by the DLL 24, as a clock for the DQS output control circuit 32 without alteration, as the internal clock to be supplied to the DQS output control circuit. When the DLL non-selection mode has been set, the DLL 24 can be turned off, and consumption of power by the DLL 24 can be thereby reduced. Alternatively, when the DLL non-selection mode has been set, power of the DLL circuit may be automatically turned off. The semiconductor memory device 1 in this example includes the DLL circuit. Then, the DLL selection circuit 31 selects whether or not to use the DLL. The semiconductor memory device 1 may primarily include only the DLL non-selection mode without the DLL 24.

As the registers that control the ODT, an embedded termination value setting register that sets the resistance value of the embedded termination resistance provided at each of the DQ terminal and DQS terminal, a dynamic ODT mode selection register for selecting dynamic ODT, a write command execution time termination resistance value specifying register that specifies a termination resistance value at a time of execution of a write command when the dynamic ODT has been selected, and a nominal termination resistance value specifying register that specifies a termination resistance value at a time other than the time of execution of the write command.

FIG. 5 is a block diagram showing a portion of the data input/output unit 25 related to embedded termination resistance control. FIG. 5 shows one of eight DQ terminal input/output circuits included in the semiconductor memory device 1. A portion related to embedded termination resistance control is the same among the DQS terminal input/output circuits. Referring to FIG. 5, a P-channel output buffer 87 and an N-channel output buffer 88 serve as an output buffer for the DQ terminal and an embedded termination resistance for the DQ terminal. An output data control circuit 82 is a circuit which generates a signal that controls the output buffer when the DQ terminal is an output terminal. A termination resistance value determination circuit 83 is a circuit that determines whether to turn on or off the termination resistance and determines the resistance value of the termination resistance when the termination resistance is turned on, using the registers that controls the ODT and the ODT terminal. A latency counter 85 is a circuit that counts the number of clocks CK from reception of the read command to start of output of read data. A selection circuit 84 is a circuit that selects whether to control a prebuffer 86 using an output signal of the output data control circuit 82 or an output signal of the termination resistance value determination circuit 83. In a normal state of the selection circuit 84, the prebuffer circuit 86 is controlled by the termination resistance value determination circuit 83. Only when a read flag is set and then the read command is executed, the buffer circuit 86 is controlled by the output data control circuit 82.

A termination resistance control circuit 81 is a circuit that performs control to forcibly turn off the embedded termination resistance irrespective of the initially set resistance value of the embedded termination resistance and irrespective of the voltage level of the ODT terminal. The termination resistance control circuit 81 performs control so that the selection circuit 84 selects the output signal of the output data control circuit instead of the output signal of the termination resistance value determination circuit 83 when the read command is supplied, the read flag is set, and then the latency counter 85 informs arrival of an output timing of read data. When output of the read data is completed and then the read flag is reset, the termination resistance control circuit 81 functions so that the selection circuit 84 selects the output signal of the termination resistance value determination circuit 83.

The prebuffer 86 receives an output signal of the selection circuit and controls turning on or off of the P-channel output buffer 87 using a P-channel output buffer control signal PC and turning on or off of the N-channel output buffer 88 using an N-channel output buffer control signal NC. When the P-channel output buffer 87 and the N-channel output buffer 88 are functioned as the termination resistance, the prebuffer 86 outputs a low level of the P-channel output buffer control signal PC and a high level of the N-channel output buffer control signal NC, thereby turning on both of the P-channel output buffer 87 and the N-channel output buffer 88. When the termination resistance is turned off, the prebuffer 86 controls the P-channel output buffer control signal PC to be high and controls the N-channel output buffer control signal NC to be low. When the P-channel output buffer 87 and the N-channel output buffer 88 are functioned as the output buffer and a high level is output from the DQ terminal, the prebuffer drives both of the P-channel output buffer control signal PC and the N-channel output buffer control signal NC low, thereby turning on the P-channel output buffer 87 and turning off the N-channel output buffer 88. When a low level is output from the DQ terminal, the prebuffer 86 drives both of the P-channel output buffer control signal PC and the N-channel output buffer control signal NC high, thereby turning off the P-channel output buffer 87 and turning off the N-channel output buffer 88. Though not illustrated in FIG. 5, a plurality of buffer transistors are connected in parallel at the P-channel output buffer 87 and the N-channel output buffer 88. The resistance value of the embedded termination resistance is controlled by how many of the buffer transistors connected in parallel are turned on. Further, an input buffer 89 transmits data received through the DQ terminal to an internal circuit.

Originally, the function of the embedded termination resistance is different from the function of the output buffer. Thus, each of the embedded termination resistance and the output buffer may be controlled independently in view of the original functions. In the first example, however, when the read command that uses the function of the output buffer is executed, the embedded termination resistance is turned off. Thus, in the first example, the embedded termination resistance and the output buffer can share a circuit.

FIG. 6 shows set termination resistance values in the first example suitable for performing high-speed data transfer without using the synchronous circuit such as the DLL when the semiconductor memory device 1 does not include the synchronous circuit or the semiconductor memory device 1 includes the synchronous circuit but does not use the synchronous circuit. A description will be directed to a difference from FIG. 2 alone. Though no particular limitation is imposed, a case where two ranks of DIMM1s are mounted and only one rank of a DIMM2 is mounted is excluded in FIG. 6 in order to place importance on symmetry and prevent reflection as much as possible. That is, the mounted numbers of the ranks of the DIMM1s and DIMM2s are the same. Resistance values of embedded termination resistances are all set to 120Ω. Values of the embedded termination resistances when a write command is executed without using the dynamic ODT and values of the embedded termination resistances otherwise are the same. The embedded termination resistances are turned off only at a time of execution of the read command. Otherwise, the values of the embedded termination resistances are all set to 120Ω. That is, there is no need on the side of the memory controller 2 for changing control using the ODT terminal for each rank according to whether a command is the read command or the write command and on which rank the read command or the write command is to be executed.

Accordingly, after the memory controller has set the resistance values of the embedded termination resistances of each semiconductor memory device to 120Ω by initial setting, the memory controller performs control so that the high level is supplied to the ODT terminal of the semiconductor memory device 1 of any rank to turn on the embedded termination resistances when the read command or write command is executed on one of the ranks. Though not described in this FIG. 6, when the read command or the write command is not executed on the semiconductor memory device 1 of any rank, the memory controller sets the ODT terminal to be low to turn off the embedded resistances of each of the semiconductor memory devices. Consumption of power that flows through the embedded termination resistances can be thereby reduced.

Assume that the memory controller 2 controls turning on/off of the termination resistances of the semiconductor memory device 1 using an ODT signal. Then, when read and write commands are successive, a lot of timing constraints with respect to turning on/off of the termination resistance are imposed on switching in the course of successive operations of the read and write commands. Data buses are especially pipelined. Thus, it is difficult to align timings of the data buses when the synchronous circuit of the semiconductor memory device 1 is not operated. When the termination resistances of the semiconductor memory device 1 in the first example are controlled as in FIG. 6, it is not necessary to control the embedded termination resistances using the ODT terminal in the course of the successive operations. When the read and write commands are successive, the ODT signal is raised at the beginning of the successive operations and the ODT signal is fallen at the end of the successive operations in the first example. Accordingly, even when the semiconductor memory device 1 does not include the synchronous circuit, control by the ODT signal does not cause a bottleneck for the high-speed data transfer.

FIG. 7 is a sectional view of the wiring substrate in the example of the present invention. Referring to FIG. 7, the memory controller 2 and memory module sockets (DIMM sockets) 95 are provided on a motherboard 91. Memory modules 96 for the DIMM1s and the DIMM2s are respectively mounted on two of the memory module sockets 95. The semiconductor memory devices 1 of Rank-1 and Rank-2 are mounted on both surfaces of the substrate for the memory module 96. A common data bus 92 common to the respective DIMMs is routed on the motherboard from the memory controller 2 to a branch point 94. The common data bus 92 includes DQ data buses and DQS data strobe signal lines. Routing from the branch point 94 to each of the DIMM1s and the DIMM2s is performed so that wiring lengths from the branch point 94 to the respective DIMM1s and DIMM2s are equal. With such wiring, signal reflection is prevented.

Figure 8:
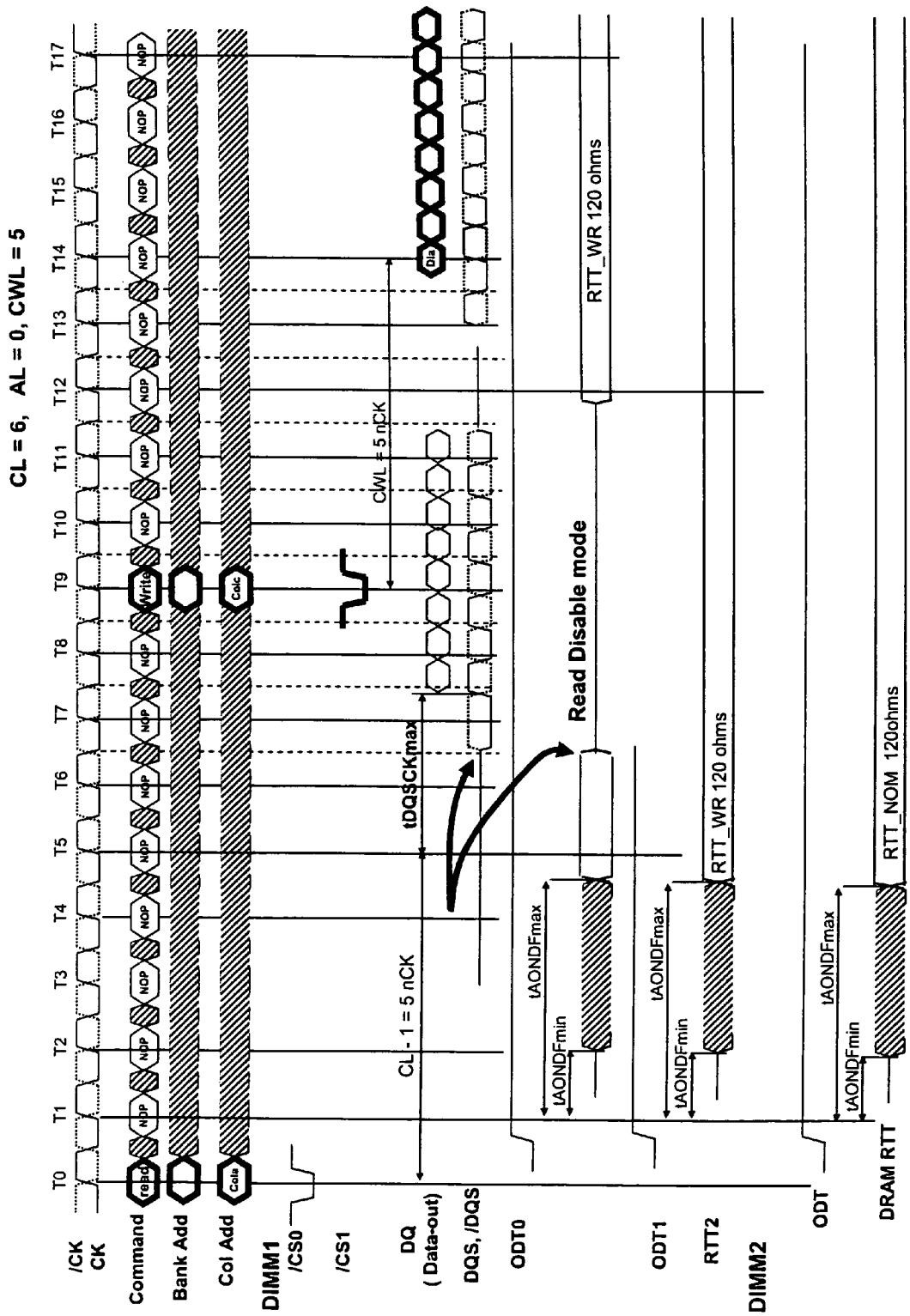
FIG. 8 is a timing diagram in the example of the present invention, in which a read command is executed after a write command.

Next, an operation in the first example will be described. FIG. 8 is a timing diagram when the write command is executed after execution of the read command. In FIG. 8, "CK" denotes a system clock signal that is supplied to a CK terminal of the semiconductor memory device 1 from the memory controller, "/CK" is an inverted signal of the "CK" signal, which is supplied to a "/CK terminal". FIG. 8 shows the CK signal by a solid line and the /CK signal by a broken line. "Command" denotes a command that is supplied to the semiconductor memory device 1 from the memory controller 2, and "Bank Add" and "Col Add" respectively denote a bank address and a column address when the command is supplied to the semiconductor memory device 1.

Referring to the semiconductor memory devices 1 of the DIMM1s, "/CS0" denotes a chip select signal of Rank-1, and "/CS1" denotes a chip select signal of Rank-2, and "DQ" denotes data supplied to or output from the DQ bus. "DQS" and "/DQS" are respectively non-inverting and inverting data strobe signals. The "DQS" signal is indicated by a solid line, while the "/DQS" signal is indicated by a broken line. "ODT0" and "ODT1" are respectively termination resistance control signals output from the memory controller 2. "RTT2" shows a state of the termination resistances included in the semiconductor memory device 1 of DIMM1 Rank-2.

Further, referring to the semiconductor memory devices 1 of the DIMM2s , "ODT" denotes termination resistance control signals ODT2 and ODT3 for the DIMM2s, and "DRAM RTT" denotes a termination resistance state. It is assumed that a CAS latency CL is set to six, an additive latency (Additive Latency) AL is set to 0, and a CAS write latency (CAS Write Latency) CWL is set to 5. Further, as shown in FIG. 6, resistance values of the embedded termination resistances of all the semiconductor memory devices 1 are set to 120Ω.

Referring to FIG. 8, the read command is supplied at a rise of a T0 cycle. At this point, a low-level pulse is supplied as the /CS0 signal for the DIMM1. Thus, this read command is a read command for DIMM1 Rank-1. As shown in FIG. 6, when the read command or the write command is supplied to one of the ranks of the DIMM1s or DIMM2s, the high level is supplied to the ODT terminal of any rank in the first example. Herein, the high level is supplied to all of the ODT0 and ODT1 signals and the ODT signals of the DIMM2s at the timing of a rise of a T1 cycle. Then, the embedded termination resistances of each rank are turned on after an elapse of a time tAONDF, and each of the embedded termination resistances of any rank assumes the resistance value of 120Ω set in advance. It cannot be helped that the time tAONDF taken from the rise of the ODT terminals to turning on of the embedded termination resistances greatly varies when the synchronous circuit such as the DLL is not operated. A minimum value tAONDFmin of the time tAONDF is on the order of 2.0 ns, while a maximum value tAONDFmax of the time tAONDF is on the order of 7.0 ns.

In the semiconductor memory device 1 of the DIMM1 Rank-1, output of read data is started at a time delayed from a rise of a T5 cycle by only a time tDQSCK, in response to the read command and in synchronization with the data strobe signal DQS. The T5 cycle is a fifth cycle from the T0 cycle. The output of read data is started at that time because the DLL non-selection mode (DLL-off mode) is based on the rise of the T5 cycle, and is based on the timing one cycle earlier than a T6 cycle determined when the CAS latency is set to six and the additive latency is set to zero. In the DLL non-selection mode, the DQS signal output from the DQS terminal rises at a time to which the time tDQSCK has been added. The time tDQSCK is a delay time of the rise of the data strobe signal caused by a phase delay of the internal clock with respect to the system clock. The time tDQSCK is on the order of 2.0 to 5.0 ns. Referring to FIG. 8, the DQS signal rises at a time of a maximum value tDQSCKmax of the time tDQSCK.

Before output of the read data is started at a rise of the DQS terminal, the DQS terminal is driven low from a high-impedance state. A preamble signal is thereby output. Simultaneously with output of this preamble signal, the embedded termination resistances of the semiconductor memory device 1 of the DIMM1 Rank-1 are turned off. Accordingly, the embedded termination resistance provided at each of the DQ terminal and the DQS terminal does not prevent output of the read data. Further, the embedded termination resistances provided at the DQ and DQS terminals of the semiconductor devices of the DIMM1 Rank-2 and the DIMM2s maintain the state of 120Ω. Accordingly, reflection of a signal output from the semiconductor memory device 1 of the DIMM1 Rank-1 at the DQ terminal or the DQS terminal of the semiconductor memory device of other rank to interfere with data transfer to the memory controller 2 can be prevented.

Next, the memory controller 2 outputs the write command at the start of a T9 cycle during transfer of the read data, gives a low level to the chip select signal /CS1 of the DIMM1, and supplies the write command to the semiconductor memory device 1 of the DIMM1 Rank-2. The memory controller 2 does not need to change the voltage level of the ODT signals, with execution of this write command. It is because the memory controller 2 has already driven the ODT signals of all the ranks high with execution of the read command so that the embedded termination resistances of the semiconductor memory devices 1 are turned on. The embedded termination resistances of the semiconductor memory device 1 of the DIMM1 Rank-1 that has output the read data with execution of the read command are turned on again with execution of the read command, thereby returning to the state of 120Ω. With respect to output of write data from the memory controller with execution of the write command, capture of the data into the semiconductor memory device 1 is started at a T14 cycle after five cycles from the T9 cycle where the write command has been supplied, because the CAS write latency CWL is set to five. The embedded terminal resistances of all the ranks have returned to the state of 120Ω before that timing of capturing the data.

As described above, even when the DLL non-selection mode is selected or even when the synchronous circuit such as the DLL or a PLL is not originally included in the semiconductor memory device 1 and on/off timing of the embedded termination resistances or the output timing of read data cannot be synchronized with the system clock CK supplied from the memory controller with good accuracy, a wait time for on/off control of the embedded termination resistances is not needed. Thus, data transfer associated with execution of the read or write command can be efficiently performed at high speed. It is because, when switching of the embedded termination resistances associated with execution of the read command or the write command is performed, the embedded resistances are uniformly turned on except turning off the embedded resistance at a time of execution of the read command (at a time of outputting read data including a preamble and a postamble). Control over turning off of the embedded resistance associated with execution of the read command is performed inside the semiconductor memory device 1 in synchronization with a data output timing. Turning off of the embedded resistance associated with execution of the read command is not executed by termination resistance control terminal control by the memory controller. Accordingly, read data output and on/off control over the embedded resistances are associated with only a relative timing difference inside the semiconductor memory device on which the read command is executed. Thus, even if the semiconductor memory device does not include the synchronous circuit such as the DLL, synchronization can be achieved with a comparatively good accuracy.

Further, when it is not necessary to execute the read command or the write command on the semiconductor memory device of any rank, the memory controller drives the termination resistance control signal low. Each termination resistance of the semiconductor memory device 1 of any rank can be turned off, thereby stopping current that flows through the termination resistance.

Figure 9:
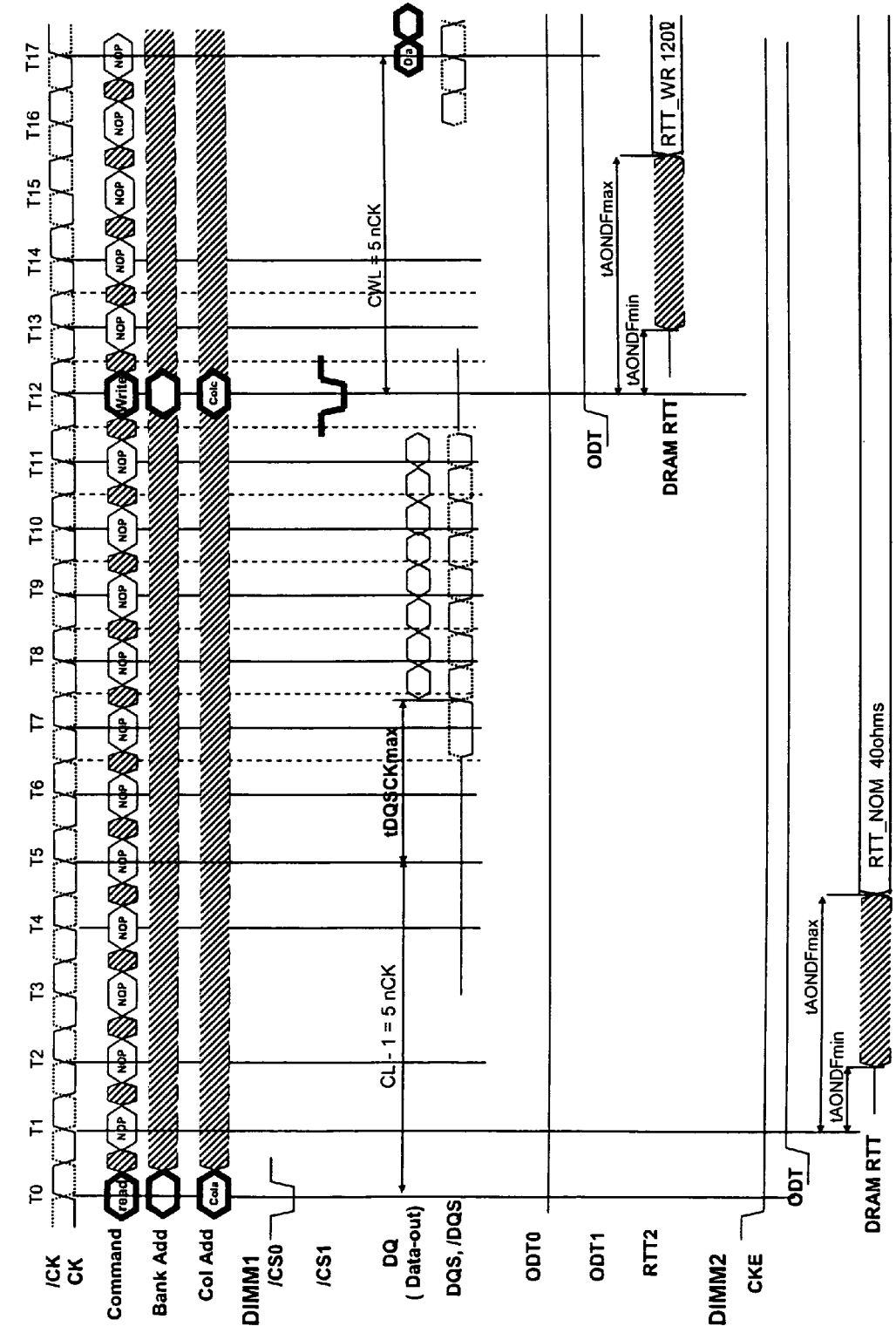
FIG. 9 is a timing diagram in a comparative example of the present invention, in which the read command is executed after the write command.

Now, for comparison, a timing diagram when a write command is executed on a related art semiconductor 101 and a memory controller 102 (refer to FIG. 1) will be shown. The timing diagram shows the case where the write command is executed after execution of a read command in the DLL-off mode as in FIG. 8. Referring to FIG. 9, it is assumed that termination resistance control is also performed by related art termination resistance control shown in FIG. 2. In a description about FIG. 9, descriptions about portions that are the same as those in FIG. 8 will be omitted. FIG. 9 is different from FIG. 8 in that, first, an ODT0 signal maintains low, and that a rise of an ODT1 signal from low to high occurs after data transfer associated with execution of the read command has been completed. That is, when the read command is executed on DIMM1 Rank-1, embedded termination resistances of the DIMM1 Rank-1 and DIMM1 Rank-2 are turned off, based on FIG. 2. When the write command is executed on the DIMM1 Rank-2, the embedded termination resistance of the DIMM1 Rank-2 becomes 120Ω, and the embedded termination resistance of the DIMM1 Rank-1 is turned off. Further, embedded termination resistances of the DIMM2s are 40Ω. Accordingly, ODT signal control as described above is needed. Herein, there is a problem of a rise timing of the ODT1 signal. An output timing of read data from the semiconductor memory device 101 is greatly varied, as already described. Accordingly, a rise of the ODT1 signal must be delayed in view of a case of a maximum value tDQSCKmax, where output of the read data is delayed as much as possible, and must be delayed from a time to which the delay of the maximum value tDQSCKmax has been added. Further, after the memory controller 102 has driven the OTD1 signal high, a timing of supplying the write command must be delayed, assuming a case of a time tAONDFmax where rises of the embedded termination resistances of the semiconductor memory device 101 are delayed most. Referring to FIG. 9, the memory controller 102 supplies the write command at the beginning of a T12 cycle, which is three cycles later than the T9 cycle in the first example. It can be seen from the comparison between FIG. 8 and FIG. 9 as well that when the synchronous circuit is not used, a wait time due to turning on/off of the termination resistances by the ODT signal is not generated in the first example, and higher data transfer efficiency is achieved in the first example.

SECOND EXAMPLE

Next, a second example of the present invention will be described. When a semiconductor memory device 1 does not use a synchronous circuit, it is most preferable that resistance values of termination resistances be set to be uniform and one of the termination resistances is turned off only when data is output due to execution of a read command. However, even when the resistance values of the termination resistances are set to resistance values other than those in FIG. 6, such as resistance values in FIG. 2, control timings of the termination resistances can be made the same between a power-down mode and a normal operation mode. The power-down mode is a mode that is present in a related art DDR SDRAM as well. In the power-down mode, even if a read/write command is supplied from a memory controller, the semiconductor memory device 1 does not respond to the command. Power consumption can be thereby saved. In the normal operation mode, when the read command or the write command is supplied from the memory controller, the semiconductor memory device 1 responds to the command. The semiconductor memory device 1 thereby performs a read/write operation.

FIG. 10 is a timing diagram when the semiconductor memory device 1 executes the write command in the second example. In this case, it is assumed that the semiconductor memory devices 1 of DIMM1s are in the normal operation mode, while the semiconductor memory devices 1 of DIMM2s are in the power-down mode. As values of the termination resistances, the values of the related art shown in FIG. 2 are adopted. Referring to FIG. 10, an additive latency (Additive Latency) AL is set to five, which is different from that in FIG. 8 in the first example. Accordingly, capture of data due to execution of the write command is started 10 cycles (CWL+AL=5+5=10) after supply of the write command.

Referring to FIG. 10, the write command is supplied to DIMM1 Rank-2 at a rise of a T0 cycle. Capture of write data in response to the write command is started at a rise of a T10 cycle which is 10 cycles after the write command has been supplied. It is seen that an ODT1 signal for a DIMM1 and an ODT signal for the DIMM2s are driven high at the rise of the T0 cycle. Since the additive latency Al is set to five, the termination resistances of the DIMM1 Rank-2 and the termination resistances of the DIMM2s are turned on after a time tAONDF from a rise of a T5 cycle. The T5 cycle occurs five cycles after the T0 cycle. FIG. 10 shows cases where the time tAONDF is maximum and minimum. However, the termination resistances of the DIMM1 Rank-2 in the normal operation mode are turned on at substantially the same time as the termination resistances of the DIMM2s in the power-down mode. In this example, using a dynamic ODT function described in the DDR3 standard, the embedded resistances of the DIMM1 Rank-2 targeted for execution of the write command are set to 120Ω, which is the value of the termination resistances when the write command is executed. Then, the termination resistance values of the DIMM2 are set to 40Ω, which is the value of the termination resistances at a time other than when the write command is executed.

Next, the ODT1 signal is driven low from high before a rise of a T9 cycle. Then, when the time tAOFDF has elapsed from a rise of a T14 cycle that is five cycles after the T9 cycle, the termination resistances of the DIMM1 Rank-2 are turned off.

In this second example, the time from the rise of the ODT1 signal to turning on of the termination resistances of the DIMM1 Rank-2 in the normal operation mode and the time from the rise of the ODT signal to turning on of the termination resistances of the DIMM2s in the power-down mode, for example, are both tAONDF, and are substantially the same except for variations. Though not described in FIG. 10, the time from a fall of the ODT signal to turning off of the termination resistances in the normal operation mode and the time from a fall of the ODT signal to turning off of the termination resistances in the power-down mode are both tAONDF, and are substantially the same. Accordingly, the memory controller may perform control over the embedded terminal resistances irrespective of whether the semiconductor memory device 1 is in the power-down mode or the normal operation mode.

Figure 11:
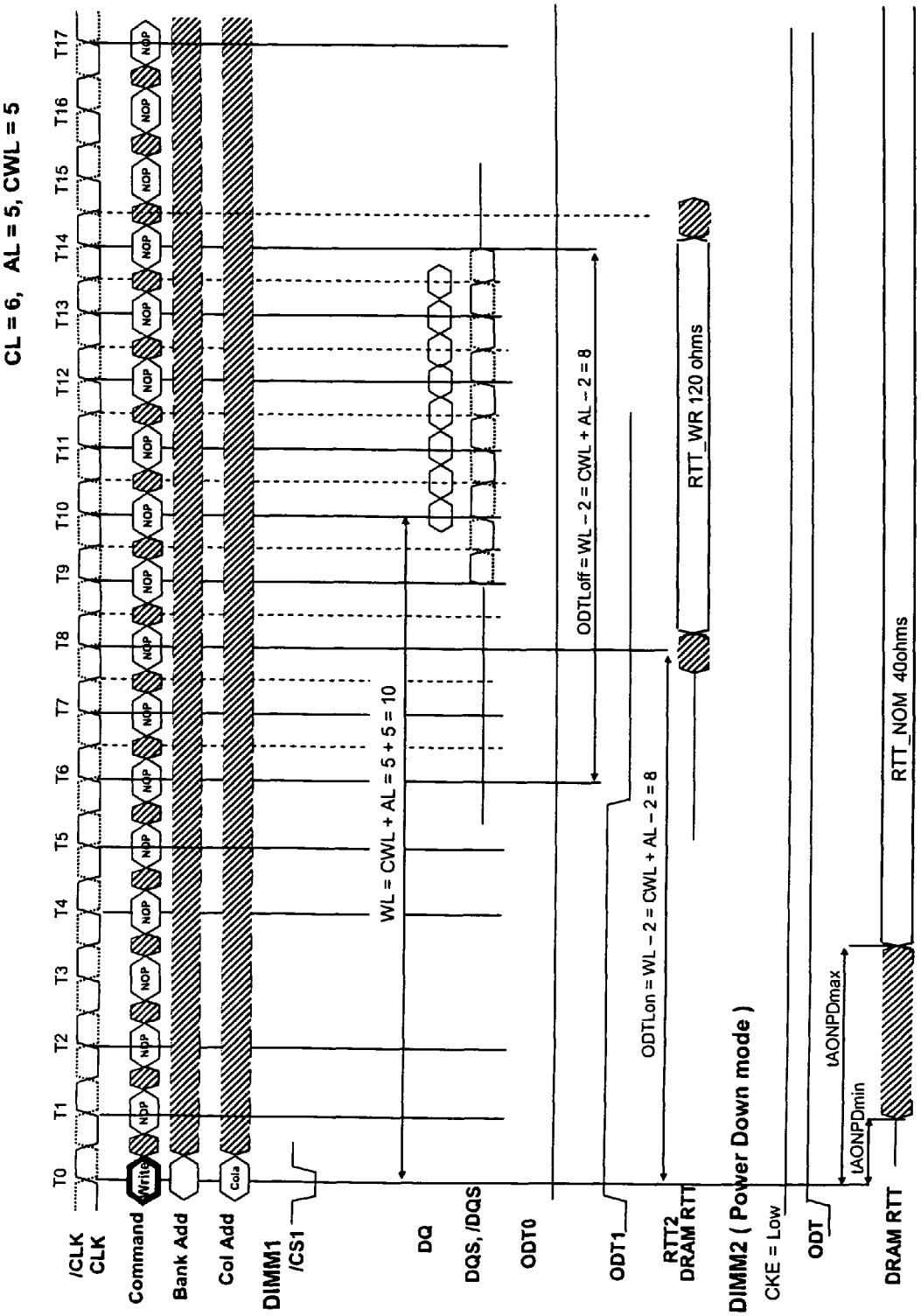
FIG. 11 is a timing diagram when the write command is executed in a comparative example of the present invention.

A comparative example for the second example will be shown in FIG. 11. FIG. 11 is a timing diagram when the memory controller performs control so that a same result as that in the second example may be obtained in a DDR3 SDRAM. Unless otherwise specified, same conditions as those in the second example are used. The DIMM1 Rank-2 is in the normal operation mode. Thus, turning on/off of the embedded termination resistances is switched by a DLL, in synchronization with a system clock. In the normal operation mode, after an ODT terminal has been raised, the embedded termination resistances are turned on after an elapse of a time ODTon, which is equal to (CWL+AL−2) cycles. After the ODT terminal has been fallen, the embedded termination resistances are turned off after the elapse of the time ODTon, which is equal to the (CWL+AL−2) cycles.

On the other hand, the time from a rise of the ODT signal to turning on of the termination resistances of the DIMM2s in the power-down mode depends on a time tAONPD, as in FIG. 10 in the second example. In the second example, a time when the termination resistances are turned on is determined, based on reflection of the additive latency AL of five and based on the T5 cycle after five cycles from the rise of the ODT signal. On contrast therewith, the additive latency Al of five is ignored in the DDR 3 SDRAM in the power-down mode in FIG. 11. A time when the termination resistances are turned on is determined, based on the T0 cycle in which the ODT signal has been raised. Accordingly, as readily understood from FIG. 11, the time from a rise of the ODT1 signal to turning on of the termination resistances of the DIMM1 Rank-2 in the normal operation mode greatly differs from a timing from a rise of the ODT signal to turning on of the terminal resistances of the DIMM2s in the power-down mode. Though not described in FIG. 11, the time from a fall of the termination resistance control signal ODT signal to turning off of the termination resistances differs between the normal operation mode and the power-down mode. Accordingly, generally, the memory controller must change a control timing for the termination resistances, depending on whether the semiconductor memory devices are in the power-down mode or the normal operation mode. Thus, a burden of the memory controller is larger than in the second example.

The above description was directed to the semiconductor memory devices where the DLL circuit is included and function switching can be made, depending on whether the DLL circuit is used or not. The present invention is effective for a semiconductor memory device that does not originally include the DLL circuit, and a memory system and a wiring substrate in which such a semiconductor memory device is used, as well.

The above description was made in connection with the examples. The present invention is not limited to the configurations of the examples described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A memory system comprising:
   a plurality of semiconductor memory devices each comprising a termination resistance circuit that is able to be controlled to be turned on or off by a termination resistance control signal; and
   a memory controller including a termination resistance control unit that outputs the termination resistance control signal so that when a read command or a write command is executed on one of the semiconductor memory devices, termination resistances of all of the semiconductor memory devices are turned on,
   the termination resistance circuit of one of the semiconductor memory devices being turned off, irrespective of a level of said termination resistance control signal when the one of the semiconductor memory devices outputs data in response to the read command.

2. The memory system according to claim 1, wherein each of the semiconductor memory devices comprises a normal operation mode in which the read command and the write command are able to be executed and a power-down mode in which execution of the read command and the write command is stopped, and on/off timings of the termination resistance circuit by the termination resistance control signal in the normal operation mode and the power-down mode are substantially the same.

3. The memory system according to claim 1, wherein the termination resistance control unit sets an initial resistance value of said terminal resistance circuit; and
   wherein each of the semiconductor memory devices comprises a normal operation mode in which a write command and the read command are able to be executed and a power- down mode in which execution of the write command and the read command is stopped, and on/off timings of the termination resistance circuit by the termination resistance control signal in the normal operation mode and the power-down mode are substantially the same.

4. The memory system according to claim 1, wherein each of the semiconductor memory devices includes a termination resistance value specifying register, and the memory controller initializes a value of each termination resistance that is specified by the termination resistance value specifying register to a certain fixed value.

5. The memory system according to of claim 1, wherein the semiconductor memory devices are divided into a plurality of ranks and connected to the memory controller, command and address signals are supplied in common to the semiconductor memory devices of each rank from the memory controller, and the termination resistance control signal is independently supplied for each rank.

6. The memory system according to claim 1, wherein when the memory controller controls operation of the memory system so that the read or write commands are successively executed from a state where the read or write command is not executed on any of said semiconductor memory devices, and then the operation is returned to the state where the read or write command is not executed to any of the semiconductor memory devices, said termination resistance control unit performs control so that the termination resistance circuits of the semiconductor memory devices are turned on prior to data transfer associated with the successive read or write commands, and then performs control so that the termination resistance circuits of the semiconductor memory devices are turned off after a data transfer associated with the successive read or write commands, and during the data transfer, a level of the termination resistance control signal for each of the semiconductor memory devices is held on active.

7. The memory system according to claim 1, further comprising:
data buses that connect the memory controller and said semiconductor memory devices each and have substantially equal wiring lengths from the memory controller to the semiconductor memory devices each.

8. The memory system according to claim 7, wherein said data buses comprise:
a common bus that connects said memory controller and a branch point; and
a plurality of branch buses each of which connects a corresponding one of the semiconductor memory devices from the branch point, and
wherein the branch buses have a mutually substantially equal length.

9. The memory system according to claim 1, wherein the termination resistance circuit of remaining semiconductor memory device(s) of the semiconductor memory devices has been turned on, irrespective of the read command to the one of the semiconductor memory devices.

10. The memory system according to claim 1, wherein
the termination resistance control unit that outputs the termination resistance control signal to all of the semiconductor memory devices when the read command or the write command is executed on one of the semiconductor memory devices.

11. The memory system according to claim 1, wherein each of the semiconductor memory devices includes a selection circuit selecting an output of an output data control circuit in response to a read data read from a memory cell array when the read command is executed, and selecting an output of a termination resistance value determination circuit when the read command is not executed.

12. The memory system according to claim 11, wherein each of the semiconductor memory devices includes a prebuffer coupled between the selection circuit and an output buffer to control a termination resistance of the output buffer in response to the output of the termination resistance value determination circuit when the read command is not executed, and to control an output level in response to the output of the output data control circuit when the read command is executed.

13. The memory system according to claim 1, wherein the termination resistance circuit controls a termination resistance of an input/output terminal of the semiconductor memory device thereon.

14. The memory system according to claim 1, wherein each of the termination resistance circuits controls a termination resistance of an input/output terminal of the corresponding one of the semiconductor memory devices.

15. The memory system according to claim 1, wherein the termination resistance circuit controls a termination resistance of all of the semiconductor memory devices to same termination resistance when a write command is executed, and controls a termination resistance of one of the semiconductor memory devices differing to a termination resistance of remaining of the semiconductor memory devices irrespective of a level of the termination resistance control signal.

16. The memory system according to claim 1, wherein the memory controller does not change a level of the termination resistance control signal to the termination resistance circuit of all of the semiconductor memory devices in response to the read command when the memory controller has already output the termination resistance control signal.

* * * * *